US006320384B1

United States Patent
Doty et al.

(10) Patent No.: US 6,320,384 B1
(45) Date of Patent: Nov. 20, 2001

(54) THERMAL BUFFERING OF CROSS-COILS IN HIGH-POWER NMR DECOUPLING

(76) Inventors: David F. Doty, 700 Clemson Rd., Columbia, SC (US) 29229-4339; George Entzminger, Jr., 125 Halling Dr., Columbia, SC (US) 29223

( * ) Notice: Subject to any disclaimer, the term of this patent is extended or adjusted under 35 U.S.C. 154(b) by 0 days.

(21) Appl. No.: 09/331,518
(22) PCT Filed: Dec. 19, 1997
(86) PCT No.: PCT/US97/23645
   § 371 Date: Jun. 22, 1999
   § 102(e) Date: Jun. 22, 1999
(87) PCT Pub. No.: WO98/30917
   PCT Pub. Date: Jul. 16, 1998

Related U.S. Application Data

(60) Provisional application No. 60/033,907, filed on Dec. 23, 1996.

(51) Int. Cl.$^7$ ........................................ G01V 3/00
(52) U.S. Cl. ........................................ 324/321; 324/322
(58) Field of Search .................................. 324/321, 322, 324/318, 300, 306, 307, 309

(56) References Cited

U.S. PATENT DOCUMENTS

| | | |
|---|---|---|
| 3,771,055 | 11/1973 | Anderson . |
| 4,456,882 | 6/1984 | Doty . |
| 4,563,648 | 1/1986 | Hill . |
| 4,641,098 | 2/1987 | Doty . |
| 4,940,942 | 7/1990 | Bartuska et al. . |
| 5,162,739 | 11/1992 | Doty . |
| 5,202,633 | * 4/1993 | Doty et al. .................. 324/321 |
| 5,424,645 | 6/1995 | Doty . |
| 5,508,615 | 4/1996 | Doty et al. . |
| 6,130,537 | * 10/2000 | Doty et al. .................. 324/321 |

OTHER PUBLICATIONS

Barbara, T.M., 'Cylindrical Demagnetization Fields and Microprobe Design in High–Resolution NMR', J. Magn. Reson. Ser. A, 109, 265–69, 1994.
Doty, F.D., 'Probe Design and Construction', Encyclopedia of NMR, vol. 6, Wiley Press, 1996.
Doty, F.D., 'Solid State NMR Probe Design', Encyclopedia of NMR, vol. 7, Wiley Press, 1996.

* cited by examiner

*Primary Examiner*—Louis Arana
(74) *Attorney, Agent, or Firm*—Oppedahl & Larson LLP

(57) ABSTRACT

A transverse rf saddle coil (30) for use in NMR is affixed in intimate thermal conract on one surface of a ceramic coilform (23) of high thermal conductivity. The probe is mostly for use with solid samples at high fields where the axis of the coilform is not alignedwith the main field. An orthogonal rf coil (1) is mounted in intimate thermal contact to the first saddle coil (30) via a ceramic spacer or coilform (2). The coilform is cooled by high-velocity gas flow and is also often associated with bearing exhaust gas from a high speed sample spinner. The two coils are tuned to different rf frequencies with circuits capable of supporting high rf currents. The rf coils (30, 1) may be magnetically compensated and expansion controlled, and passive geometric compensation of magnetic susceptibility effects from a sample spinner stator may also be incorporated. Novel coil mounting techniques, including metallurgical bonds to ceramics and capturing by dielectric clam-shells, are also disclosed.

27 Claims, 4 Drawing Sheets

THERMAL BUFFERING OF CROSS-COILS IN HIGH-POWER NMR DECOUPLING

This application claims benefit of Provisional Application 60/033,907, filed Dec. 23, 1996.

TECHNICAL FIELD

The field of this invention is the measurement of nuclear magnetic resonance (NMR) for the purpose of determining molecular or microscopic structure, and, more particularly, a novel coil arrangement for NMR measurements of samples requiring simultaneous high-power excitation at more than one frequency.

BACKGROUND ART

There have been numerous applications for double and triple resonance circuits in NMR of solid samples with high-power decoupling for the past three decades. The most common application is irradiating at the proton ($^1$H) high frequency (HF) resonance to decouple its dipolar broadening effects while observing Bloch decays on a nuclide of lower magnetogyric ratio such as $^{13}$C at a low frequency (LF). Other common examples of multiple resonance circuits include cross-polarization (CP) and Rotational Echo Double Resonance (REDOR). A number of specialized techniques—Dynamic Angle Spinning (DAS), Double Rotation (DOR), single-crystal, etc.) have been developed during the past decade to improve spectral resolution of solid samples, and the probe requirements of some of these are reviewed briefly by Doty in 'Solid State NMR Probe Design', The NMR Encyclopedia, Vol. 6, Wiley Press, 1996. More recently, inverse NMR techniques on liquids are being applied to nuclides with large chemical shifts, where high power decoupling is sometimes needed on the LF channel.

For experiments on solid samples at high static magnetic field $B_0$ (greater than 7 T), where large rf fields $B_1$ are required, typical voltages across the sample coil are 2 to 6 kV. In U.S. Pat. No. 5,162,739, Doty discloses an improved method of balancing a double-tuned high-power circuit so that proton $B_1$ can exceed 2 mT ($\gamma B_1$=85 kHz) at 400 MHz with 0.3 ml samples in a Cross Polarization Magic Angle Spinning (CPMAS) probe that is broadbanded on the LF channel and uses a sample spinner such as the one described by Doty et al in U.S. Pat. No. 5,508,615 (note the extensive list of typographical corrections). Broadband (multinuclear) triple-resonance circuits as disclosed by Doty in U.S. Pat. No. 5,424,645 have provided multinuclear tuning capability on an LF and Mid-Frequency (MF) channel with high-power $^1$H decoupling for various NMR experiments such as REDOR and double CP.

The above referenced prior art typically achieves MF and LF rf efficiencies $\eta_E$ of 35% to 60% (percentage of power delivered to sample coil) for 5 mm solenoidal sample coils (sample volume about 0.1 ml) at 12 to 7 T, but HF efficiencies of balanced coils are typically under 35% at 300 MHz and decrease to under 20% at 600 MHz. It has recently been shown that irradiating with very high decoupling fields (up to 150 kHz) for longer acquisition times (up to 300 ms) can achieve nearly liquid-like resolution in many complex solid samples if other factors (susceptibility effects, sample preparation, magic angle precision, thermal gradients, and spinning speed) are also properly addressed. However, prior art coils and circuits are not capable of this level of proton decoupling above 200 MHz unless major sacrifices (factors of 2 to 4) are made in MF and LF sensitivity. The instant invention permits, without a corresponding loss in sensitivity, approximately a factor of three increase in both decoupling efficiency and maximum decoupling $B_1$ above 700 MHz, and some advantages are realized as low as 200 MHz.

For the past five decades, NMR probes for solid samples have almost exclusively utilized solenoidal sample coils, as the solenoid achieves higher filling factor $\eta_F$ and Q for small samples than the saddle coil and the related transverse resonators usually used in high-resolution NMR probes for liquids. Moreover, the multi-tuned single-solenoid may simplify CP with uncompensated coils. However, transverse coils in combination with solenoids permit geometric isolation by virtue of their zero mutual inductance, and this allows the use of circuits with considerably higher rf efficiency. Consequently, several attempts have been made over the past decade to combine transverse coils and solenoids advantageously for multiple-resonance solids NMR at high field, as had been done from very early days for liquids NMR in low-field magnets, as disclosed by Anderson in U.S. Pat. No. 3,771,055.

Known prior art attempts at combining transverse resonators with solenoids in solids NMR probes have all placed the transverse coil outside the solenoid, primarily because the transverse coil has been used for $^1$H decoupling and the $\eta_F Q$ product is less important at higher frequencies. Thus, the inner solenoid is easily optimized for maximum LF and/or MF sensitivity. However, such prior art attempts have not been satisfactory because solids NMR at high fields is generally applied to sample sizes below 6 mm, where it is critical that spacing between coils be minimized to maintain acceptable $\eta_F$ on the outer coil. While flat wire may be preferred for single-coil solenoids of more than five turns, the three-turn to five-turn solenoids generally needed at very high fields have better Q and $B_1$ homogeneity if at least the final turn at each end is of heavy, round wire. Thus, considerable radial space is desired for the solenoid. Moreover, it is very difficult to affix a coil like this to the inside of a coil former in a way that achieves both high $B_1$ and $B_0$ homogeneity.

In one embodiment of the instant invention, a thin transverse $^1$H decoupling coil is affixed in intimate thermal contact on the inside of a ceramic coilform of high thermal conductivity, thereby allowing this coil to handle high-energy pulses without significantly reducing the filling factor of an outer solenoidal rf coil. Relatively minor modifications in the Supersonic MAS Spinner of U.S. Pat. No. 5,508,615 are required to accommodate an inner transverse coil and an outer solenoidal coil, although more extensive modifications would be required in some designs currently in use. Generally speaking, rf efficiency of the $^1$H decoupling circuit is greatly increased, especially at high fields, while Q is somewhat decreased. The LF and MF frequencies often see little change in sensitivity, as efficiency improvements are offset by a loss in filling factor. However, very high LF and MF field strengths may be achieved more readily, as it is now easier to balance the LF and MF circuits, and this results in a considerable increase in sensitivity in multiple-quantum techniques.

The concepts disclosed herein enabling greatly improved decoupling efficiency in broadband double resonance NMR spinning techniques for solids are also applicable to non-spinning techniques (single crystal and wide-line) and to doubly-broadband triple and quad-resonance circuits for NMR techniques requiring three or four high-power channels. If sufficient attention is paid to magnetic compensation of the coils and advantageous spinner symmetries and if leak-proof susceptibility-matched plugs are used in the rotor, $B_0$ homogeneity may be improved by an order of magnitude, and the novel coil arrangement may be applied to MAS of liquid samples, as used in combinatorial chemistry techniques for drug design. Finally, some of the novel techniques may be applied to high-power decoupling (especially X-nucleus) in conventional high-field high-resolution NMR of liquid samples.

DISCLOSURE OF INVENTION

A transverse rf foil saddle coil for use in NMR is affixed in intimate thermal contact on one surface of a ceramic cylindrical coilform of high thermal conductivity—often for solid samples at high fields where the axis of the coilform is not aligned with $B_0$. An orthogonal rf coil is mounted in intimate thermal contact to the first saddle coil via a ceramic spacer or coilform. The coilform is cooled by high-velocity gas flow—often also associated with bearing exhaust gas from a high speed sample spinner. The two coils are tuned to different rf frequencies with circuits capable of supporting high rf currents. The rf coils may be magnetically compensated and expansion controlled, and passive geometric compensation of magnetic susceptibility effects from a sample spinner stator may also be incorporated. Novel coil mounting techniques, including metallurgical bonds to ceramics and capturing by dielectric clamshells, are also disclosed.

MODE FOR CARRYING OUT THE INVENTION

Figure 2:
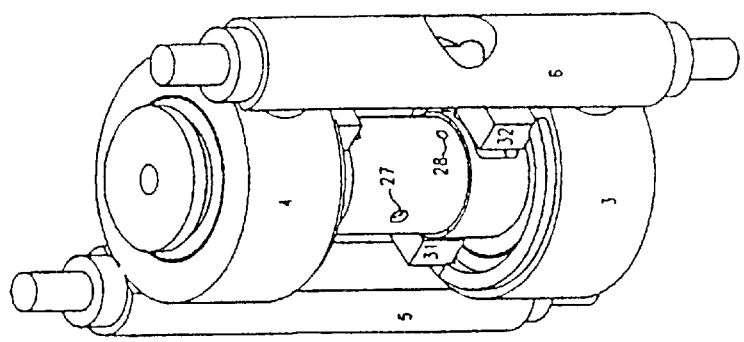
FIG. 2 is a perspective rendering of a portion of the MAS assembly of FIG. 1.
Figure 1:
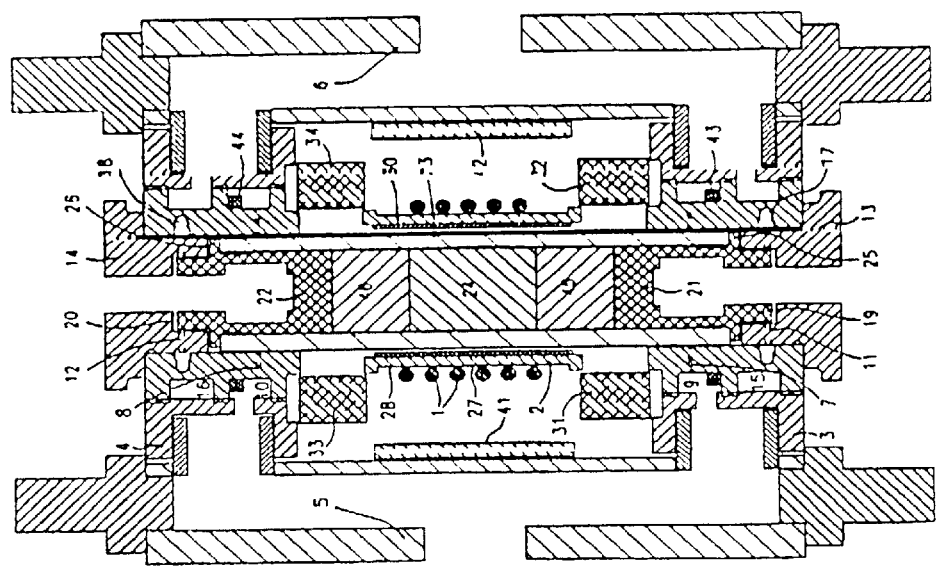
FIG. 1 is a section view of an MAS spinner with an inner cross coil and an outer solenoidal coil.

The manifolding modifications of the MAS spinner disclosed in FIGS. 1 and 2 permit improved access to the coil region, as required for practical manufacturing when two rf coils are used. Prior art supersonic NMR sample spinners similar to that of U.S. Pat. No. 5,508,615 have often been furnished with a solenoidal rf coil 1 on the outside (rather than inside, as shown in that patent) of the ceramic coilform 2 to simplify manufacturing, but the continuous (full-length) outer sleeve arrangement of the prior art is impractical when two coils are required. Separate manifolding sleeves 3, 4 at each end may be supplied with bearing gas through a bearing tube 5 on one side, and drive gas may be supplied through a drive tube 6 on the other side, leaving the central coil region readily accessible. To facilitate variable temperature operation and to improve magnetic homogeneity, a clamshell (split-cylinder) cover 41, 42 (not shown in FIG. 2) with suitable lead holes may be removably affixed around the central coil region after the coils are mounted and tuned.

The bearing gas is distributed to the bearing holes 7, 8 via bearing grooves 9, 10. Drive gas is distributed to the drive nozzles 11, 12 in nozzle caps 13, 14 via drive grooves 15, 16 into plenums 17, 18. High velocity drive gas then impinges on the turbine blades 19, 20 on the ends of the plastic turbine caps 21, 22 to provide the required drive torque to the ceramic rotor 23 containing sample 24. Bearing gas exhausts over the annular thrust bearings 25, 26 on the turbine caps 21, 22 at each end and through central exhaust holes 27, 28.

For $B_0$ above approximately 9 T, it becomes necessary to balance conventional multi-tuned single-coil circuits at the proton frequency, as shown, for example in U.S. Pat. No. 5,162,739, to prevent voltage breakdown and to reduce noise problems associated with ground loops, even though balancing results in reduced rf efficiency. Geometric isolation of resonances by using two orthogonal sample coils 1, 30 reduces the requirements of isolation traps within the rf circuit and thus permits much higher circuit efficiency at one or more resonances. However, in order for it to be beneficial, the loss in filling factor of the outer coil must be offset by the gain in rf efficiency of one or both coils. To minimize the loss in filling factor of the outer coil, the inner coil and the insulation between the coils must be rather thin.

The arrangement shown permits simplified manufacturing from hard ceramics and simplified mounting of an inner segmented rf cross coil 30, and its tuning capacitors 31, 32, 33, 34 along with the outer rf coil 1. For improved $\eta_F Q$ of both coils and improved $B_0$ homogeneity, it is necessary to increase the coilform and rotor length compared to the referenced prior art. An increase in rotor length-to-diameter ratio of typically 25% is possible without significantly compromising the efficient spinning performance of the prior art or excessively complicating sample packing.

With a segmented inner coil, the limiting concern is usually pulse heating or susceptibility rather than voltage breakdown. Reducing the thickness of the inner coil 30 increases the effects of pulse heating, but this is often necessary for satisfactory performance over a wide range of temperatures, as will be shown later. Unless the thin, inner coil 30 is in intimate thermal contact with a coilform of high thermal conductivity, high-energy pulses may cause severe de-tuning, unacceptable Johnson noise, burning of the adhesive film, and/or melting of solder joints. For example, a 20 J pulse (such as 150 W for 0.2 s with 67% rf efficiency) applied to a 0.1 mm thick Alderman-Grant coil for use with a 5 mm MAS rotor would increase the temperature of the edges around the central flux windows (where most of the current is concentrated) by approximately 400° C. (even with typical bearing air flow) if mounted on quartz, pyrex, macor (a machinable boro-alumino-silicate glass-ceramic by Corning), or other material of low thermal conductivity (k<2 W/mK), as rf currents in excess of 12 A per side are typically required for 150 kHz decoupling, although 25 kHz (at least 2 A) is sometimes adequate. (Note that the peak currents in the high-inductance prior art of Anderson were typically much less than 1 A.) However, if the coilform is of beryllia, aluminum nitride, alumina, silicon nitride, or magnesia (k>15 W/Km) and the coil is in intimate thermal contact, the edge temperature rise may be reduced by a factor of five or more, depending on the thickness of the coilform and the thermal mass of the outer rf coil if it too is in intimate contact with the coilform.

Current concentrations and hence peak edge heating are greatly reduced in multi-turn transverse resonators, but their high inductance causes severe high-voltage breakdown problems. The optimized parallel-single-turn segmented saddle coil (similar to FIG. 7 of U.S. Pat. No. 4,641,098) shown in FIG. 3, which we call the split-half-turn (SHT) coil, has somewhat lower edge-current density than prior art Alderman-Grant-type resonators and improved $B_1$ homogeneity. The optimized SHT coil solves voltage breakdown problems, but other low-inductance transverse resonators as disclosed in a copending application result in more uniform current distributions and hence more reduction in edge heating. If such coils are used, satisfactory performance may be obtained with thin coils (under 0.07 mm) on a ceramic coilform of moderately low thermal conductivity, especially if its volumetric heat capacity $\rho C_p$ is large, as for PSZ (partially stabilized zirconia, see Table 1) and forsterite.

Of course, the peak edge heating of the inner coil may be reduced by making it much thicker than 0.1 mm with marginal effect on filling factor of the outer coil, but this could result in unacceptable $B_0$ inhomogeneity for many of the newer MAS applications for liquid samples unless the foil is magnetically compensated with a core of positive susceptibility (but preferably not ferro-magnetic or highly paramagnetic) in the proper ratio. The standard Cu—Al—Cu sandwich techniques typically achieve a factor of five to ten reduction in bulk magnetization for thin foils compared to pure copper, although the edge heating problem may be increased a little by the higher electrical resistivity of the core material. However, bonding thick metal foils to ceramics with sufficient adhesion to tolerate a wide operating temperature range is a major challenge. This is especially true for silicon nitride because of its ultra low thermal expansion. Yet, silicon nitride is generally the preferred material, as beryllia is extremely toxic, magnesia is rather weak, alumina and aluminum nitride often present unacceptable background signals, and zirconia has very high dielectric constant and marginal thermal conductivity. While forsterite ($2MgO$—$SiO_2$) is often an acceptable choice, the high thermal conductivity of silicon nitride is beneficial in reducing thermal gradients within the sample and thereby improving spectral resolution.

Many high-adhesion ceramic metallization techniques are magnetically unacceptable, as they involve manganese, palladium, or nickel. Vapor deposition of copper or silver followed by copper electroplating and chemical etching is quite expensive, especially because of the difficulty of applying the etch resist to the inside of a small cylinder, and adhesion is generally inadequate. Securing a copper foil to the inside of the ceramic using an active braze alloy (such as Ag—Cu—Ti) is even more problematic, although bond strength can be extremely high. Using a sandwich core material of low thermal expansion, low susceptibility, and high modulus helps reduce thermal stress in the bond between the sandwich foil and the ceramic and thus permits an extended operating temperature range with epoxy or thermoplastic polyimide (PI, such as aurum) film bonding. However, the low thermal conductivity of polymers requires the adhesive film to be less than 50 microns thick for useful pulse heat transfer (thermal conduction greater than 4,000 W/m²K). Preferably, the polymeric film is about 4 microns thick, which further exacerbates the thermal stress problem. In order of decreasing effectiveness, the beneficial sandwich core metals include tungsten, iridium, rhenium, molybdenum, rhodium, hafnium, tantalum, and chromium, although only tungsten, iridium, and rhenium are of much benefit and tungsten-rhenium alloys are generally preferred, owing to their ductility, in controlling thermal expansion in a compensated copper or silver sandwich. In some cases, iridium may be more effective in controlling thermal stresses, depending on the adhesive film thickness.

It is generally much easier to mount the inner coil if it has been etched on a thin copper-clad or silver-clad substrate such as glass-filled PTFE or PI. Because of the extreme difficulty in chemically etching a sandwich cladding with a W, Ir, Re, Mo, Rh, or Hf core, it is easier to start with conventional copper or silver cladding, etch the desired pattern, plate with the desired compensating metal, and then plate another layer of copper or silver. Plating methods may not be readily available for rhenium or hafnium, but iridium, tungsten, molybdenum, and rhodium plating methods are well developed, and chemical vapor deposition techniques for tungsten have been highly developed for the semiconductor industry. Methods of plating copper or silver onto all of these metals are well known.

Numerous other magnetism sources are likely to be of greater significance than the inner copper coil if it is no more than 0.1 mm thick or magnetically compensated—especially, the manifold sleeves 3, 4, inner coil tuning capacitors 31, 32, 33, 34, the outer rf coil 1, exhaust holes 27, 28, lead holes for the tuning capacitors, and, for applications other than MAS, other geometric variations from simple cylindricity such as the central clearance region for the inner coil. These magnetic perturbations may be mitigated by a combination of compensation and passive shimming techniques. If the clamshell cover 41, 42 over the central coil region is of proper susceptibility and thickness, it can compensate major perturbations that occur (when the axis is not at the magic angle) from the manifold sleeves and still be easily removable for access to the capacitors and outer coil. The bearing grooves 9, 10 may be partially filled by split compensation rings or wires 43, 44 of proper susceptibility (such as a molybdenum or W—Re alloy) to largely compensate the axial effects (those not averaged by spinning) from the tuning capacitors, their lead holes, and the bearing groove walls. The outer coil 1 may be magnetically compensated and expansion controlled, as discussed later. The chip capacitors 31, 32, 33, 34 have typical mean susceptibility of about 10 ppm. They may be compensated by soldering small blocks of silver or gold to each end of appropriate size. Fortunately, the magnetic compensation problems are normally much less demanding than in conventional high-resolution liquids probes because high speed MAS averages most $B_0$ inhomogeneities (especially the odd-order symmetric variations) to the value along the spinning axis. Moreover, the $B_0$ shift from isotropic magnetic cylinders aligned with the magic angle is essentially constant along the axis. This characteristic makes susceptibility matching of the plugs 45, 46 to the sample 24 not critical in MAS, as long as the plug material and sample are magnetically isotropic and the angle has been set precisely. For improved resolution at angles other than 54.7°, the plugs would usually be zirconia or glass-filled PEEK, but more diamagnetic materials such as PPS or Kel-F would sometimes provide a better match.

There are times, such as in Dynamic Angle Spinning (DAS), when it is necessary to operate at angles other than 54.736°. The easiest way to minimize $B_0$ inhomogeneity for high resolution at a variety of angles is to use only uniform cylinders (constant ID and OD) or magnetically compensated materials within at least one sample radius from the sample boundaries. (Note that while $\eta_F$ of the solenoid is proportional to the square of the sine of the angle between its axis and $B_0$, $\eta_F$ for the transverse coil is independent of the coilform orientation with respect to rotations about the transverse $B_1$ axis. Hence, decoupling field strength will be independent of angle.)

Figure 4:
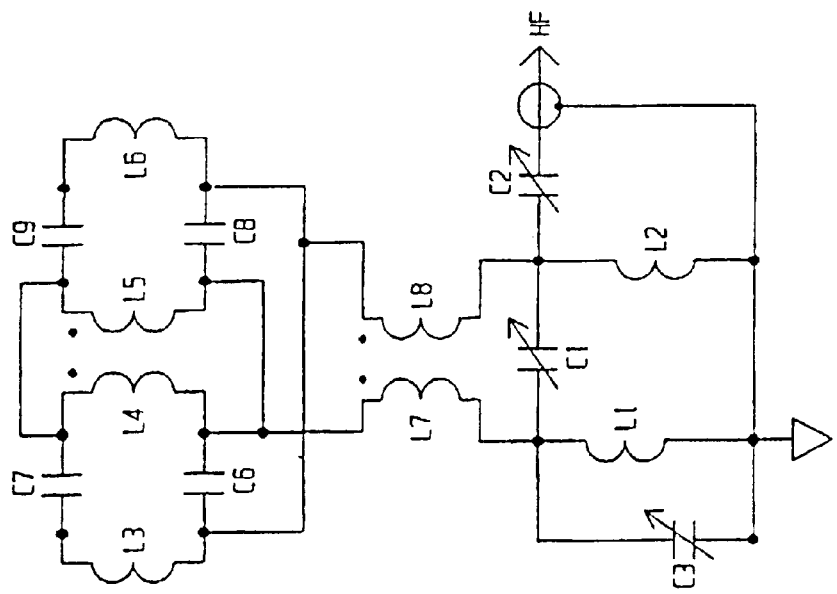
FIG. 4 shows a schematic diagram of a tuning circuit for the coil of FIG. 3.
Figure 3:
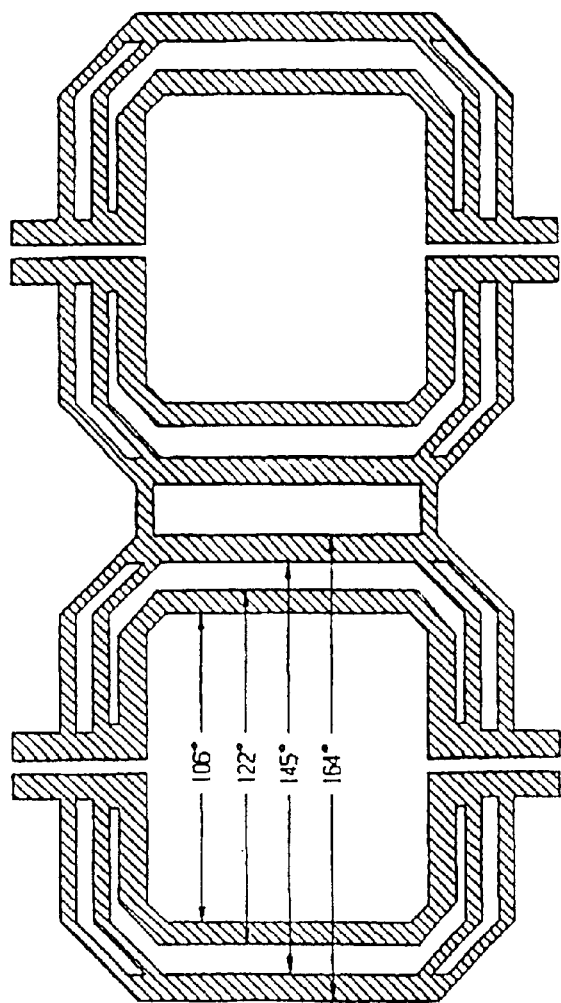
FIG. 3 illustrates a typical split-half-turn saddle coil.

The split-half-turn coil of FIG. 3 may be easily tuned to at least 900 MHz for diameters up to 6 mm using the circuit of FIG. 4. Efficiency above 70% is readily achieved, even with a moderately long, light-weight balanced transmission line L7, L8 if the segmented coupled sample coil L3, L4, L5, L6 is tuned rather close to resonance by segmenting and tuning capacitors C6, C7, C8, C9. Balance coils L1, L2 are used to increase the high frequency tuning range and reduce lead losses by canceling common-mode stray capacitance.

inductance—and still have the necessary transverse field components if one transverse coil is rotated 45°, the other is rotated −45° about the coilform axis, and the solenoid is aligned with the coilform axis. The filling factor of each transverse coil is reduced by about a factor of two ($\sin^2 45° =$

TABLE 1

Typical Properties of Coilform Materials at 7 T, 300 K, 300 MHz

| Material | Density $\rho$ kg/m$^3$ | Dielectric Constant $\epsilon$ | Loss $\epsilon$ tan $\delta$ % | Thermal Cond., $\kappa$ W/mK | Specific Heat, $C_P$ J/kgK | Diffusivity $\kappa/\rho C_P$ m$^2$/s × 1E6 | Thermal Expan. K$^{-1}$, ppm | Modulus GPa | Magnetic Suscept. $\chi$, ppm |
|---|---|---|---|---|---|---|---|---|---|
| PI | 1330.00 | 3.10 | 0.50 | 0.18 | 1000.00 | 0.14 | 55.00 | 3.00 | −8.90 |
| Quartz | 2250.00 | 3.80 | 0.04 | 1.40 | 700.00 | 0.90 | 0.50 | 74.00 | −12.00 |
| Macor | 2520.00 | 5.90 | 3.00 | 1.70 | 750.00 | 0.90 | 9.00 | 64.00 | −12.00 |
| PSZ | 5700.00 | 23.00 | 5.00 | 3.00 | 490.00 | 1.10 | 9.50 | 200.00 | −8.80 |
| MgO | 3400.00 | 9.60 | 0.20 | 20.00 | 955.00 | 6.20 | 13.50 | 250.00 | −18.00 |
| Si$_3$N$_4$ | 3250.00 | 7.00 | 0.70 | 25.00 | 740.00 | 10.40 | 3.20 | 310.00 | −14.00 |
| Al$_2$O$_3$ | 3950.00 | 9.90 | 0.10 | 35.00 | 780.00 | 11.30 | 8.00 | 390.00 | −14.20 |
| Re | 21020.0 | ∞ | — | 71.00 | 137.00 | 25.00 | 6.60 | 460.00 | 96.00 |
| Ir | 22500.0 | ∞ | — | 147.00 | 130.00 | 51.00 | 6.80 | 440.00 | 38.00 |
| W | 19250.0 | ∞ | — | 173.00 | 133.00 | 67.00 | 3.80 | 410.00 | 80.00 |
| Cu | 8950.00 | ∞ | — | 400.00 | 490.00 | 91.00 | 16.50 | 122.00 | −9.60 |

Differential tune variable capacitor C1 typically can provide a frequency tuning range of about 10% with negligible effect on B$_1$ homogeneity or $\eta_F Q$ if the characteristic impedance of the transmission line L7, L8 is properly selected—typically between 60 and 150Ω.

The outer rf solenoidal coil 1 (FIG. 1) should have lower surface coverage than in prior art single-coil configurations for improved transparency to the transverse field of the inner coil. Moreover, the use of round wire rather than flattened wire for the outer coil results in considerably less reduction in $\eta_F Q$ of the inner coil. For low-inductance solenoids (4-turns or less), B$_2$ (outer coil) homogeneity may be substantially improved by using two parallel round wires with increased spacing between turns in the central region, according to the prior art, but of somewhat smaller wire size. For best B$_0$ homogeneity, the wires would normally be magnetically compensated. To improve heat transfer from the ceramic coilform during long pulses on the inner coil, the outer coil may be slightly flattened and intimately bonded to the coilform. Using copper-plated (or silver-plated) iridium, tungsten, rhenium, or molybdenum wire reduces thermal stresses in the copper-ceramic bond and thus permits extended temperature operation. Tungsten-rhenium alloys containing 3% to 30% rhenium are particularly advantageous for core wire because of their ductility and strength. Often, it would also be desirable to plate the cladding with 0.1 to 1.0 microns of gold, rhodium, or iridium for corrosion protection with negligible effect on Q or magnetism.

It is also possible to achieve some advantage over prior art with the locations of the transverse and solenoidal coils reversed, as an inner solenoid may be of thin foil with modest sacrifice in its performance and acceptable loss in performance of an outer transverse coil. However, the initially described configuration with an inner transverse coil and an outer solenoid would usually be preferred.

In some cases it is desired to provide high power irradiation simultaneously at both the $^1$H and the $^{19}$F resonances, which differ by only 6%. One method of achieving this is to double-tune either the inner or the outer coil according to conventional techniques. Another method is to add a second transverse coil according to the method of Anderson. Two transverse coils and a solenoidal coil may all be magnetically orthogonal to each other—i.e., have zero mutual 0.5), but this is still often better than the alternative double-tuning method.

Figure 5:
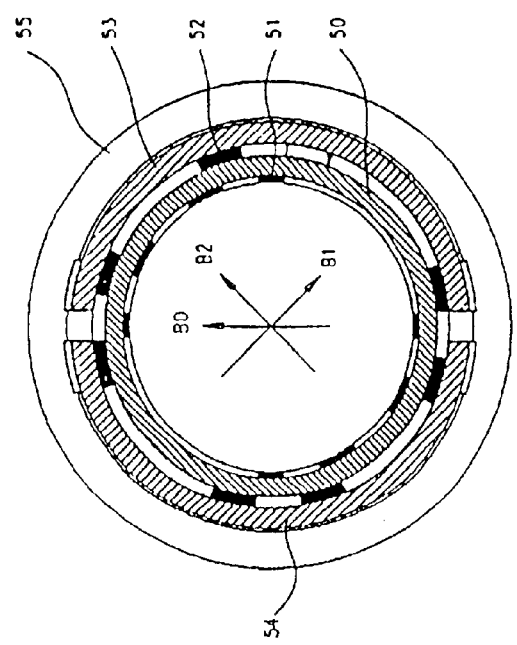
FIG. 5 illustrates a typical three-coil arrangement for NMR of solids.

In this three-coil arrangement as illustrated schematically in FIG. 5. the first transverse coil 51 is on the inside of the coilform 50 rotated 45° with respect to the transverse axis and generates rf field B$_1$ at 45° with respect to B$_0$. A second transverse coil 52 rotated 90° with respect to the inner coil is mounted on the outside of the coilform and generates rf field B$_2$ at −45°. A split cylindrical dielectric spacer 53, 54 is placed over the second coil. A solenoid 55 may then be wrapped over the spacer to produce orthogonal field B$_3$ aligned with the axis of the coil.

Of course, the inner coil of FIG. 5 may be omitted for a two-coil configuration, which allows the middle coil 52 to be oriented perpendicular to B$_0$. While this two-coil configuration has lower filling factor than the initial configuration of FIG. 1 since the coils are further from the sample, it simplifies coil mounting and thermal stress problems, as it is not necessary to affix coil 52 with an adhesive film if it is adequately captured by dielectric spacers 53, 54. If there is a suitable method of securing the spacers and the outer solenoid 55 and high precision is maintained in the cylindricity of the coil and clamshell spacer, polymeric materials may be totally omitted, thereby making the unit suitable for proton NMR.

Figure 6:
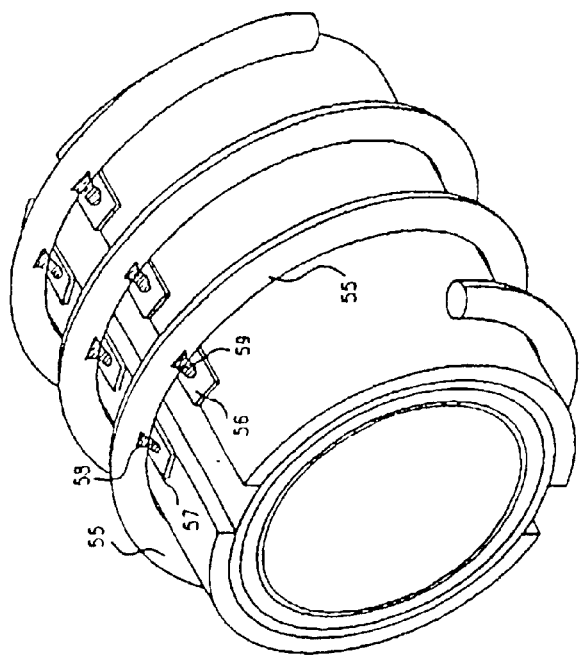
FIG. 6 illustrates a coil metallurgically bonded to a ceramic surface.

One method of securing both the spacers 53, 54 and the solenoid 55 is to apply small metallization patches 56, 57 to the outer ceramic surfaces as shown in FIG. 6 using an active braze alloy capable of producing a chemical bond (i.e., a continuous electronic structure from the base ceramic to a base metal) via conventional vacuum brazing techniques, thereby satisfying the requirement for developing high bond strength. The metal patches may then be ground and etched if necessary to several microns thick to minimize magnetic disturbances, as typical active braze alloys such as 59Ag-27Cu-12.5In-1.3Ti are quite diamagnetic. The solenoid may then be metallurgically bonded to the metalized ceramic by a non-magnetic solder or braze fillet 58, 59 or by welding. A suitable non-magnetic solder is the common 96Sn-4Ag alloy, and further improvement may be obtained by adding up to 0.5% antimony. Non-magnetic brazes may be produced from Ag—Cu—Pd—Sn—Zn—Ni alloys. Eliminating polymeric materials permits extended temperature operation and eliminates problematic NMR background signals. The azimuthal gaps between the two halves of the clamshell 53, 54 are shown greatly exaggerated for clarity. For best resolution (except when the coilform is aligned with $B_0$) these gaps must be as small as practical.

Obviously, this method of securing the outer coil may also be readily applied to solenoid 1 in FIG. 1, although it would be difficult to apply successfully to transverse coil 52 in FIG. 5, and extremely difficult to apply to inner coil 30 of FIG. 1, as previously noted. If the decouple cross coil 52 is in intimate thermal contact with high conductivity ceramic on both surfaces, it is not necessary to depend on thermal conduction to the solenoid for additional pulse energy buffering, which permits the solenoid to be spot brazed and thus virtually eliminates thermal stress problems between the solenoid and the ceramic. Of course, care must be taken to limit the extent of the metallization patches and brazing or soldering, as their high resistivity tends to reduce the Q of the coils.

Because the above mounting methods eliminate the thermal stress problems in mounting all coils, other magnetic compensation alloys, especially Cu—Ni—Cr and Al alloys, may be used for substantial cost savings. Moreover, since the thermal stress problems in mounting the cross coils have been eliminated and magnetic compensation is simplified, they may be made much thicker to reduce the edge current density and improve Q. In fact, if precisely magnetically compensated, they may be made thick enough (about 0.2 to 1 mm) to eliminate the requirement of thermal buffering via intimate thermal contact with a high-conductivity ceramic, as the thick metal sandwich itself provides sufficient thermal buffering for high-energy pulses. For best precision in magnetic compensation of thick foils, the core foil is preferably a copper-based alloy containing 4% to 10% nickel for magnetic compensation, 0.5% to 10% (Al+Cr+Mo+Nb+Re+Si+Sn+Ta+Ti+V+W) for strengthening and grain boundary stabilization, and not more than 0.05% (Fe+Co+Mn) for low ferro-magnetism. Since the pure metal (copper or silver) coil surfaces are not protected by polymeric films or adhesives, they would normally be plated with 0.1 to 1.0 micron of gold, iridium, or rhodium, according to the prior art.

As noted earlier, it is not necessary that the inner coil 52 be a transverse coil. as a solenoid may also be captured by a dielectric spacer. However. a captured solenoid may generate severe thermal stress unless the dielectric spacer is compliant. as with the heat-shrink PTFE (teflon) of the prior art.

A thick compensated cross coil 52 may be satisfactorily captured over a ceramic coilform with heat-shrink PTFE tubing (similar to prior art coils on quartz tubes aligned with $B_0$ for high resolution in high-field liquids NMR) in place of ceramic clamshell spacers 53, 54. An outer solenoid 55 may then be secured over the PTFE tubing by covering it with another piece of heat-shrink tubing. In this case. external heat removal is severely reduced, but air flow along the inside of the coilform would be adequate for many applications. Also, the coils may be captured using ceramic or glass tubes rather than clamshells if the spinner assembly is designed in such a way that the central coilform region is separable from one or both bearing/manifold end-structures. However, such spinner designs generally are not capable of the highest spinning speeds. Moreover, much tighter coil and spacer tolerances are required to achieve intimate thermal contact when the adjustability of the clamshell structure is lost.

The clamshell spacer concept may be extended to three-coil and even four-coil versions by adding, for example, another set of dielectric spacers over coil 55 and another coil over that. In this case, the outermost coil would normally be a solenoid and the inner and middle coil would typically be orthogonal transverse coils, as in FIG. 5. A copending patent application describes methods and applications for a fourth orthogonal rf coil.

Figure 8:
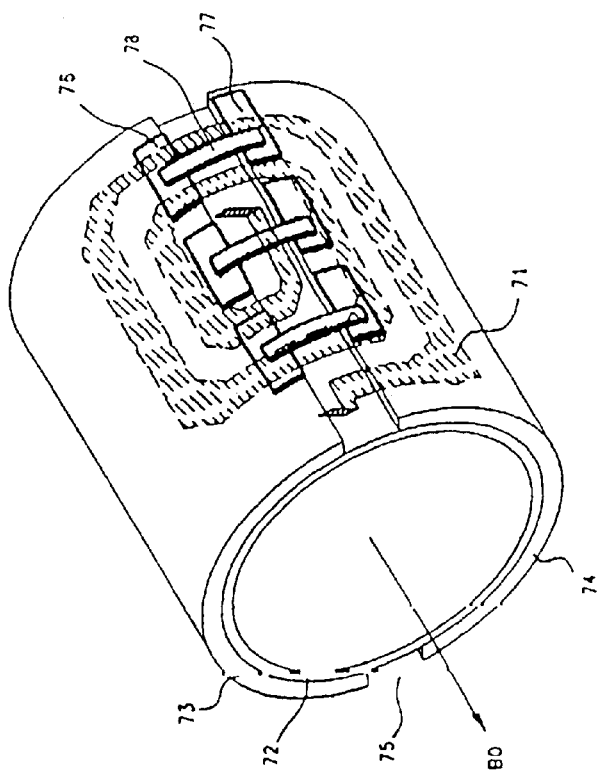
FIG. 8 is a perspective view of the mounting method of FIG. 7.
Figure 7:
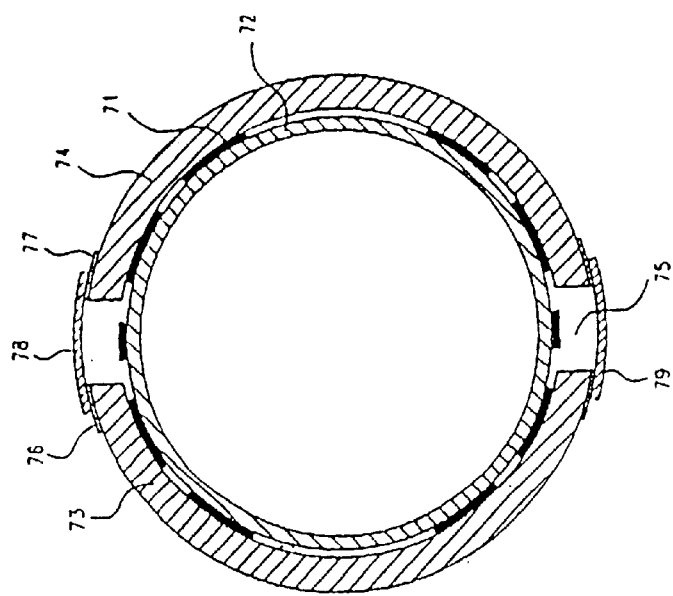
FIG. 7 is a section view of a thick-foil spiral coil captured by a split ceramic cylinder.

Finally, there are some situations in conventional high-field high-resolution NMR of liquids that benefit from the above techniques, especially with inverse techniques where very high power is sometimes needed on the low-gamma channel to achieve the desired decoupling spectral width. FIGS. 7 and 8 illustrates a thick-foil transverse coil 71 secured to a ceramic coilform 72 by an outer ceramic clamshell 73, 74. Note that the clamshell may have substantial and even asymmetric azimuthal gaps 75 without adversely affecting field homogeneity if the coilform is long compared to the sample region and aligned with $B_0$. Thin metallization patches 76, 77 are chemically bonded to the ceramic clamshell, and non-magnetic metal straps 78, 79 are metallurgically bonded to the patches to secure the coil intimately to the coilform via the clamshell. In many cases, coil 71 would be the outer coil, and there would be an inner orthogonal transverse proton coil (not shown) mounted on an inner quartz tube according to the prior art. While the split-half-turn coil of FIG. 3 and some other coils do not require insulated cross-overs, this is not normally the case—especially for low-gamma cross coils. To obtain intimate thermal contact between the coil and the ceramics in coils with insulated cross-overs, as for, example, the Zens spiral, it may be necessary to laser-cut fine slits in the clamshell through which the leads may be passed. If coil 71 is an outer coil, it would be far enough from the sample for fine slits to have negligible effect on $B_0$ homogeneity in the sample. In some cases, it is possible to simply orient the clamshell so that the leads can pass through the gap between the two halves as shown.

Many other coil, spinner, and coilform arrangements may also provide the required pulse heat sinking, convenient tuning access, magnetic homogeneity, and low thermal gradients. All such modifications and changes are intended to be included within the scope of the following claims.

We claim:

1. An NMR probe for use in an external field $B_0$, said probe comprising:
   a cylindrical ceramic coilform not in fixed alignment with said $B_0$,
   a transverse rf coil affixed in thermal contact with the inside of said coilform,
   a second rf coil mounted on the outside of said coilform,
   rf tuning capacitors and coupling means connected to said rf coils,
   said rf coils further characterized as having essentially zero mutual inductance,
   said thermal contact further characterized as having thermal conduction greater than 4,000 W/m²K,
   said coilform further characterized as having thermal conductivity greater than 2 W/mK,
   said rf coupling means further characterized as capable of supporting rf currents in
   at least one of said rf tuning capacitors in excess of 2 amperes at resonance.

2. An NMR probe as in 1 in which said coilform is also a portion of a high-speed sample spinner.

3. An NMR probe as in 1 in which one of said rf coils is a solenoid.

4. An NMR probe as in 1 in which said coilform is comprised substantially of silicon nitride, magnesia, alumina, zirconia, forsterite, or beryllia.

5. An NMR probe as in 1 wherein said first coil is capacitively segmented and includes at least four chip capacitors for tuning and segmenting.

6. An NMR probe as in 1 wherein said first coil comprises substantially an A-B-A sandwich, where A represents either Ag or Cu, and B represents an alloy comprised primarily of one or more from the set consisting of W, Ir, Re, Mo, Rh, and Hf.

7. An NMR probe as in 1 wherein said first coil comprises an etched conductor pattern on a glass-filled composite substrate.

8. An NMR probe as in 1 in which said coupling means includes at least one balanced transmission line and an inductor from each side of said line to ground.

9. An NMR probe as in 1 further characterized as comprising a third rf coil electrically isolated from said second rf coil via a dielectric spacer, said third rf coil having essentially zero mutual inductance to said transverse and second rf coils.

10. An NMR probe as in 2 further characterized in that said coilform is inclined at 54.7° with respect to said $B_0$.

11. An NMR probe as in 2 wherein said sample spinner may be aligned at various angles with respect to said $B_0$.

12. An NMR probe as in 2 wherein said sample spinner is further characterized as having removable cylindrical diamagnetic dielectric covers over a central coil region.

13. An NMR probe as in 2 wherein said sample spinner is further characterized as comprising two parallel gas supply tubes on opposite sides of said coilform.

14. An NMR probe as in 3 wherein said solenoid comprises two parallel wires of less than six turns and further characterized in that said wire comprises copper or silver plating over a low-expansion alloy of low magnetic susceptibility and high modulus.

15. An NMR probe as in 7 wherein said conductor pattern is plated first with a compensating metal and then with copper or silver, where said compensating metal is an alloy comprised primarily of one or more from the following: W, Ir, Re, Mo, Rh, Hf.

16. An NMR probe as in 11 in which said transverse rf coil is a capacitively segmented coil capable of generating uniform rf magnetic field transverse to the axis of said coilform, said second coil is a solenoid, said coilform is further characterized as comprised substantially of silicon nitride, and said sample spinner is further characterized as comprising two parallel gas supply tubes on opposite sides of said coilform.

17. An NMR probe for use in an external field $B_0$, said probe comprising:

a cylindrical ceramic coilform, a transverse rf coil in intimate thermal contact with the outside of said coilform, a cylindrical dielectric spacer in thermal contact with the outside of said transverse rf coil, a second rf coil in thermal contact with the outside of said spacer.

rf tuning capacitors and coupling means connected to said rf coils, said rf coils further characterized as having essentially zero mutual inductance, said intimate thermal contact further characterized as having thermal conduction greater than 4,000 W/m$^2$K, said coilform further characterized as having thermal conductivity greater than 2 W/mK, at least one of said rf tuning capacitors further characterized as capable of supporting rf currents in excess of 2 amperes at resonance.

18. An NMR probe as in 17 in which said coilform is also a portion of a sample spinner.

19. An NMR probe as in 17 in which said second rf coil is a solenoid.

20. An NMR probe as in 17 wherein said transverse coil includes at least four chip capacitors for tuning and segmenting.

21. An NMR probe as in 17 wherein said first coil comprises substantially an A-B-A sandwich, where A represents either Ag or Cu, and B represents a copper-based alloy containing at least 4% nickel, not more than 0.05% (Fe+Mn), and at least 0.5% additional alloying content from the following set: Al, Cr, Mo, Nb, Re, Ta, Ti, Si, Sn, V, W.

22. An NMR probe as in 17 in which said dielectric spacer is further characterized as a ceramic clamshell.

23. An NMR probe as in 22 in which said second rf coil is metallurgically bonded to said clamshell spacer at more than one point.

24. An NMR probe as in 17 further characterized as comprising a third rf coil electrically isolated from said second rf coil via a second cylindrical dielectric spacer, said third rf coil having essentially zero mutual inductance to said transverse and second rf coils.

25. An NMR probe as in 18 wherein said sample spinner may be aligned at various angles with respect to said $B_0$.

26. An NMR probe as in 25 wherein said sample spinner is further characterized as comprising bearing compensation rings having positive magnetic susceptibility greater than 30 ppm Si volumetric units.

27. An NMR probe as in 26 in which said transverse rf coil is a capacitively segmented coil capable of generating uniform rf magnetic field transverse to the axis of said coilform, said second rf coil is a solenoid, said coilform is further characterized as comprised substantially of silicon nitride, and said sample spinner is further characterized as comprising two parallel gas supply tubes on opposite sides of said coilform.

* * * * *